United States Patent
Shenoy et al.

(10) Patent No.: US 10,115,671 B2
(45) Date of Patent: Oct. 30, 2018

(54) INCORPORATION OF PASSIVES AND FINE PITCH THROUGH VIA FOR PACKAGE ON PACKAGE

(71) Applicant: QUALCOMM MEMS Technologies, Inc., San Diego, CA (US)

(72) Inventors: Ravindra V. Shenoy, Dublin, CA (US); Kwan-Yu Lai, San Jose, CA (US); Philip Jason Stephanou, Mountain View, CA (US); Mario Francisco Velez, San Diego, CA (US); Jonghae Kim, San Diego, CA (US); Evgeni Petrovich Gousev, Saratoga, CA (US)

(73) Assignee: SnapTrack, Inc., San Diego, CA (US)

( * ) Notice: Subject to any disclaimer, the term of this patent is extended or adjusted under 35 U.S.C. 154(b) by 688 days.

(21) Appl. No.: 13/748,294

(22) Filed: Jan. 23, 2013

(65) Prior Publication Data

US 2014/0035892 A1     Feb. 6, 2014

Related U.S. Application Data

(60) Provisional application No. 61/679,625, filed on Aug. 3, 2012.

(51) Int. Cl.
*H01L 23/538* (2006.01)
*G09G 3/3266* (2016.01)
(Continued)

(52) U.S. Cl.
CPC ....... *H01L 23/5389* (2013.01); *G09G 3/3266* (2013.01); *H01L 21/486* (2013.01); *H01L 23/15* (2013.01); *H01L 23/49827* (2013.01); *H01L 25/105* (2013.01); *H01L 25/50* (2013.01); *H01L 23/3121* (2013.01); *H01L 23/49833* (2013.01); *H01L 23/50* (2013.01);
(Continued)

(58) Field of Classification Search
CPC . H01L 23/5384; H01L 23/5389; H01L 23/15; H01L 23/49827
USPC .................. 257/686, 702; 438/109
See application file for complete search history.

(56) References Cited

U.S. PATENT DOCUMENTS 6,221,690 B1    4/2001  Taniguchi et al.
6,479,856 B1    11/2002 Kashihara
(Continued)

FOREIGN PATENT DOCUMENTS

CN    1604178 A    4/2005
EP    0875936 A2   11/1998
(Continued)

OTHER PUBLICATIONS

Co-pending U.S. Appl. No. 13/566,925, filed Aug. 3, 2012.
(Continued)

*Primary Examiner* — Andres Munoz
(74) *Attorney, Agent, or Firm* — Weaver Austin Villeneuve & Sampson LLP

(57) ABSTRACT

This disclosure provides systems, methods and apparatus for glass via bars that can be used in compact three-dimensional packages, including package-on-packages (PoPs). The glass via bars can provide high density electrical interconnections in the PoPs. In some implementations, the glass via bars can include integrated passive components. Packaging methods employing glass via bars are also provided.

34 Claims, 14 Drawing Sheets

(51) Int. Cl.
*H01L 25/00* (2006.01)
*H01L 23/15* (2006.01)
*H01L 23/498* (2006.01)
*H01L 21/48* (2006.01)
*H01L 25/10* (2006.01)
*H01L 23/31* (2006.01)
*H01L 23/50* (2006.01)

(52) U.S. Cl.
CPC .. *H01L 2224/16* (2013.01); *H01L 2225/1023* (2013.01); *H01L 2225/1041* (2013.01); *H01L 2225/1058* (2013.01); *H01L 2924/12044* (2013.01); *H01L 2924/1461* (2013.01)

(56) References Cited

U.S. PATENT DOCUMENTS

| | | | |
|---|---|---|---|
| 6,787,394 | B2 | 9/2004 | Farnworth |
| 7,061,102 | B2 | 6/2006 | Eghan et al. |
| 7,215,025 | B1 | 5/2007 | MacIntyre |
| 7,690,109 | B2 | 4/2010 | Mori et al. |
| 7,894,178 | B2 | 2/2011 | Wu et al. |
| 8,896,521 | B2 | 11/2014 | Lasiter et al. |
| 8,970,516 | B2 | 3/2015 | Black et al. |
| 9,190,208 | B2 | 11/2015 | Lasiter et al. |
| 2002/0012229 | A1* | 1/2002 | Schreffler ............ H05K 3/445 361/704 |
| 2002/0064028 | A1 | 5/2002 | Nielson et al. |
| 2002/0064029 | A1 | 5/2002 | Pohjonen |
| 2002/0085336 | A1 | 7/2002 | Winer et al. |
| 2002/0105774 | A1 | 8/2002 | Wermer et al. |
| 2002/0149097 | A1* | 10/2002 | Lee ................... H01L 25/0652 257/686 |
| 2003/0165615 | A1 | 9/2003 | Aaltonen et al. |
| 2004/0043629 | A1 | 3/2004 | Lee et al. |
| 2004/0046248 | A1* | 3/2004 | Waelti ................. B81B 7/0048 257/712 |
| 2004/0081131 | A1 | 4/2004 | Walton et al. |
| 2005/0073526 | A1* | 4/2005 | Nose et al. ............... 345/531 |
| 2005/0150683 | A1 | 7/2005 | Farnworth et al. |
| 2005/0248015 | A1 | 11/2005 | Palanduz |
| 2006/0024880 | A1 | 2/2006 | Chui et al. |
| 2006/0024904 | A1 | 2/2006 | Wilson |
| 2006/0254808 | A1 | 11/2006 | Farnworth et al. |
| 2006/0284685 | A1 | 12/2006 | Vaisanen et al. |
| 2007/0014919 | A1 | 1/2007 | Hamalainen et al. |
| 2007/0096282 | A1* | 5/2007 | Shim ................. H01L 23/49811 257/686 |
| 2008/0128915 | A1 | 6/2008 | Ueda et al. |
| 2008/0150065 | A1 | 6/2008 | Oda |
| 2008/0153269 | A1* | 6/2008 | Chen et al. ................... 438/491 |
| 2008/0308950 | A1 | 12/2008 | Yoo et al. |
| 2008/0317156 | A1 | 12/2008 | Sivanesan et al. |
| 2009/0152693 | A1* | 6/2009 | Sato ............... 257/668 |
| 2009/0236031 | A1* | 9/2009 | Sunohara et al. ........... 156/182 |
| 2009/0309662 | A1 | 12/2009 | Yang et al. |
| 2010/0013100 | A1 | 1/2010 | Xiao et al. |
| 2010/0144230 | A1 | 6/2010 | Tyger |
| 2010/0230787 | A1 | 9/2010 | Guiraud et al. |
| 2010/0244230 | A1* | 9/2010 | Oi ................. 257/692 |
| 2010/0327419 | A1 | 12/2010 | Muthukumar et al. |
| 2011/0024899 | A1* | 2/2011 | Masumoto et al. ......... 257/737 |
| 2011/0079917 | A1 | 4/2011 | Xia et al. |
| 2011/0089573 | A1* | 4/2011 | Kurita .................. 257/774 |
| 2011/0091687 | A1 | 4/2011 | Haque et al. |
| 2011/0147059 | A1 | 6/2011 | Ma et al. |
| 2011/0147911 | A1* | 6/2011 | Kohl et al. ................. 257/686 |
| 2011/0217657 | A1 | 9/2011 | Flemming et al. |
| 2011/0248405 | A1 | 10/2011 | Li et al. |
| 2011/0260329 | A1 | 10/2011 | Seo |
| 2011/0278732 | A1 | 11/2011 | Yu et al. |
| 2011/0291786 | A1 | 12/2011 | Li et al. |
| 2012/0048604 | A1 | 3/2012 | Cornejo et al. |
| 2012/0075216 | A1 | 3/2012 | Black et al. |
| 2012/0106117 | A1* | 5/2012 | Sundaram ......... H01L 23/49827 361/808 |
| 2012/0235969 | A1 | 9/2012 | Burns et al. |
| 2012/0286419 | A1 | 11/2012 | Kwon et al. |
| 2013/0009325 | A1 | 1/2013 | Mori et al. |
| 2013/0034688 | A1 | 2/2013 | Koike et al. |
| 2013/0200323 | A1 | 8/2013 | Pham et al. |
| 2013/0200324 | A1 | 8/2013 | Pham et al. |
| 2013/0278568 | A1 | 10/2013 | Lasiter et al. |
| 2014/0035935 | A1 | 2/2014 | Shenoy et al. |
| 2014/0144681 | A1 | 5/2014 | Pushparaj et al. |
| 2015/0041189 | A1 | 2/2015 | Lasiter et al. |

FOREIGN PATENT DOCUMENTS

| | | | |
|---|---|---|---|
| EP | 1895680 | A2 | 3/2008 |
| EP | 1983781 | A1 | 10/2008 |
| EP | 2423947 | A2 | 2/2012 |
| JP | 2006179564 | A | 7/2006 |
| JP | 2008098285 | A | 4/2008 |
| KR | 101069488 | B1 | 9/2011 |
| WO | WO-2006102639 | A1 | 9/2006 |
| WO | WO-2006134214 | A1 | 12/2006 |
| WO | WO-2009076075 | A1 | 6/2009 |
| WO | WO-2010129550 | A2 | 11/2010 |
| WO | 2010151375 | A1 | 12/2010 |
| WO | WO-2011109648 | A1 | 9/2011 |
| WO | WO-2011114774 | A1 | 9/2011 |
| WO | WO-2011132600 | A1 | 10/2011 |
| WO | WO-2011163247 | A2 | 12/2011 |
| WO | WO-2013163065 | A1 | 10/2013 |

OTHER PUBLICATIONS

International Search Report and Written Opinion—PCT/US2013/052760—ISA/EPO—dated Oct. 7, 2013.
International Search Report and Written Opinion—PCT/US2013/052547—ISA/EPO—dated Nov. 7, 2013.
International Preliminary Report on Patentability—PCT/US2011/052017, The International Bureau of WIPO—Geneva, Switzerland, dated Dec. 21, 2012.
International Search Report and Written Opinion—PCT/US2011/052017—ISA/EPO—dated Dec. 29, 2011.
Written Opinion of the International Preliminary Examining Authority—PCT/US2011/052017—ISA/EPO—dated Sep. 26, 2012.
Japanese Office Action dated Aug. 5, 2014, issued in 2013-530204.
Chinese Office Action dated Mar. 9, 2015, issued in 201180045796.7.
Office Action dated Aug. 28, 2013, issued in U.S. Appl. No. 13/235,158.
Final Office Action dated Mar. 6, 2014, issued in U.S. Appl. No. 13/235,158.
Office Action dated Aug. 8, 2014, issued in U.S. Appl. No. 13/235,158.
International Search Report and Written Opinion—PCT/US2013/071639—ISA/EPO—dated Feb. 5, 2014.
Office Action dated Sep. 4, 2014, issued in U.S. ppl. No. 13/686,620.
International Search Report and Written Opinion—PCT/US2013/037542—ISA/EPO—dated Jul. 23, 2013.
U.S. Office Action dated Mar. 13, 2014 issued in U.S. Appl. No. 13/454,978.
U.S. Office Action dated Dec. 26, 2014 issued in U.S. Appl. No. 14/523,258.
U.S. Office Action dated May 20, 2015 issued in U.S. Appl. No. 14/523,258.

* cited by examiner

INCORPORATION OF PASSIVES AND FINE PITCH THROUGH VIA FOR PACKAGE ON PACKAGE

CROSS-REFERENCE TO RELATED APPLICATION

This application claims benefit under 35 U.S.C. § 119(e) to U.S. Provisional Patent Application No. 61/679,625, titled "Incorporation of Passives and Fine Pitch Through Via for Package on Package," filed Aug. 3, 2012, which is incorporated by reference herein in its entirety and for all purposes.

TECHNICAL FIELD

This disclosure relates generally to packaging of devices and more particularly to glass via bars for interconnecting multiple layers, substrates, semiconductor dies, or other components of a package.

DESCRIPTION OF THE RELATED TECHNOLOGY

Microelectronic devices can include multiple components including electromechanical systems (EMS) dies. For example, EMS dies can be electrically connected to driver integrated circuit (IC) dies in an electronic device. Electromechanical systems include devices having electrical and mechanical elements, actuators, transducers, sensors, optical components (including mirrors) and electronics. Electromechanical systems can be manufactured at a variety of scales including, but not limited to, microscales and nanoscales. Microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers.

Packaging in a system can protect the functional units of the system from the environment, provide mechanical support for the system components, and provide an interface for electrical interconnections. Three-dimensional (3-D) packaging having multiple stacked dies can reduce package sizes in microelectronic systems.

SUMMARY

The systems, methods and devices of the disclosure each have several innovative aspects, no single one of which is solely responsible for the desirable attributes disclosed herein.

One innovative aspect of the subject matter described in this disclosure can be implemented in a package-on-package (PoP) including a bottom package vertically integrated with a second package, with the bottom package including a first die and at least one glass via bar, and the second package including a second die, such that the first die is in electrical communication with the second die through one or more glass via bars. In some implementations, the bottom package further includes a mold embedding the first die and the glass via bar.

The first and second dies can independently be, for example, a logic die, a memory die, a microelectromechanical systems (MEMS) die, a radio frequency (RF) die, a power integrated circuit (IC) die, a sensor die, and an actuator die. In some implementations, the first and second dies are different types of dies. For example, in some implementations, the first die is a logic die and the second die is a memory die. The memory die can be attached to a substrate by flip-chip attachment, for example. In some implementations, the memory die can be a through-silicon via (TSV) memory die. In some other implementations, the first and second dies can be the same type of die. For example, in some implementations, the first and second dies can both be memory dies, both be logic dies, or both be MEMS dies. The package-on-package can further include a third package vertically integrated with the bottom package and the second package such that the second package is disposed between the bottom package and the third package.

In some implementations, the glass via bar includes an integrated passive component. Examples of integrated passive components include resistors, inductors, and capacitors, and combinations thereof. The package-on-package can further include an electronic device printed circuit board (PCB) attached to and in electrical communication with the bottom package.

Another innovative aspect of the subject matter described in this disclosure can be implemented in a package including a package substrate, a die, and a glass bar including one or more through-glass vias in electrical communication with the die. The package can further include a mold embedding the glass bar and the die, with the mold disposed on and attached to the package substrate. In some implementations, the one or more through-glass vias provide a conductive pathway extending through the thickness of the mold.

Another innovative aspect of the subject matter described in this disclosure can be implemented in a method including placing a die on a package substrate, placing one or more glass via bars on the package substrate, and attaching the die and the one or more glass via bars to the substrate via solder reflow such that the one or more glass via bars and the die are in electrical communication. In some implementations, the method further includes dispensing and curing a mold compound on the substrate. The method can further include testing the die prior to placing the die on the package substrate. The method can further include testing the one or more glass via bars prior to placing the one or more glass via bars on the package substrate.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1A:
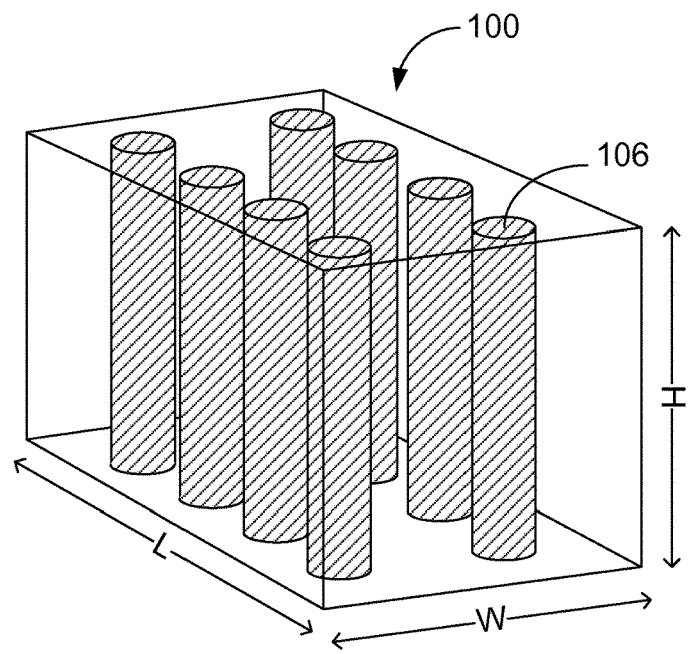
FIGS. 1A-1C show examples of isometric schematic illustrations of glass via bars.

The following description is directed to certain implementations for the purposes of describing the innovative aspects of this disclosure. However, a person having ordinary skill in the art will readily recognize that the teachings herein can be applied in a multitude of different ways. Thus, the teachings are not intended to be limited to the implementations depicted solely in the Figures, but instead have wide applicability as will be readily apparent to one having ordinary skill in the art.

Some implementations described herein relate to glass via bars that include through-glass vias. The glass via bars can be used, for example, to provide inter-level connections in stacked three-dimensional (3-D) packages. In some implementations, the glass via bars can be part of a package-on-package (PoP). In some implementations, the glass via bars can include high density arrays of through-glass vias. In some implementations, the glass via bars can include one or more passive components on a surface of and/or embedded within the glass via bars.

Some implementations described herein relate to packages including glass via bars. In some implementations, the packages can be PoPs or discrete package configured for PoP packaging. The packages can include one or more semiconductor dies and one or more glass via bars embedded within a mold structure. The glass via bars can have one or more passive components on or within the glass via bars. The packages can further include inter-level interconnects such as solder balls.

Some implementations described herein relate to methods of fabricating glass via bars. Methods of fabricating glass via bars can include forming and filling through-glass via holes of a large-area glass substrate and singulating the substrate to form multiple glass via bars. In some implementations, passive components can be formed on the glass substrate prior to singulation. In some implementations, forming through-glass via holes can include patterning and etching photo-patternable glass. Some implementations described herein relate to methods of fabricating packages including glass via bars. Methods of fabricating packages including glass via bars can include forming a mold structure embedding one or more semiconductor dies and one or more glass via bars.

Particular implementations of the subject matter described in this disclosure can be implemented to realize one or more of the following potential advantages. In some implementations, the glass via bars can provide the ability to scale the via pitch from 500 microns to 50 microns and the via diameter from 200 microns to 30 microns. Advantages of scaling the pitch and diameter include fabricating smaller packages and increasing capacity and flexibility in package design.

In some implementations, passive components can be co-fabricated with and incorporated into the glass via bar. Advantages of incorporating passive components into the glass via bar include the ability to place the passive components closer to semiconductor dies in a package, reducing the electrical path length, increasing performance, reducing the number of components, simplifying assembly, and reducing cost.

In some implementations, the glass via bars can be tested prior to incorporation into a package. The ability to test vias and passive components can provide high yields in subsequent processes of assembling known good components. In some implementations, the glass via bars can facilitate fabrication of stacked die packages.

Packaging of devices, including EMS devices and integrated circuit devices, can protect the functional units of the devices from the environment, provide mechanical support for the devices, and provide a high-density interface for electrical interconnections between devices and substrates.

Implementations described herein relate to glass via bars that include through-glass vias. The glass via bars can be used, for example, to provide inter-level connections in stacked three-dimensional (3-D) packages. In some implementations, the glass via bars can be part of a PoP. PoPs including glass via bars are described further below with respect to FIG. 6.

Figure 1B:
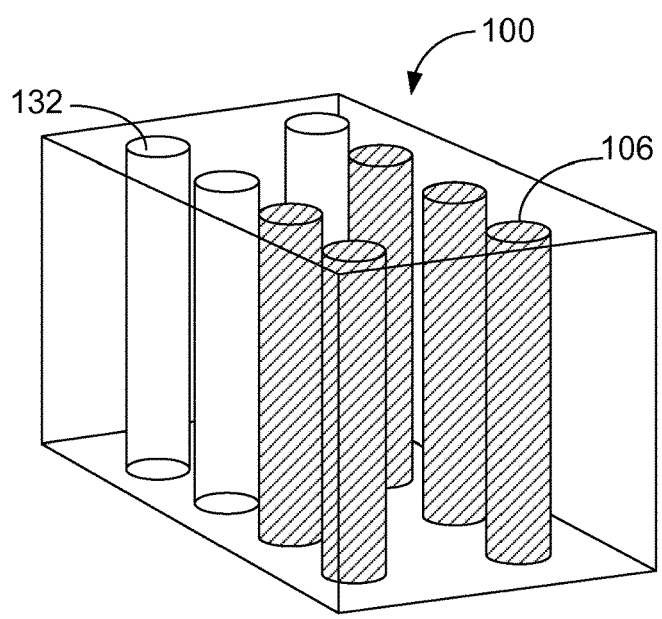
Figure 1C:
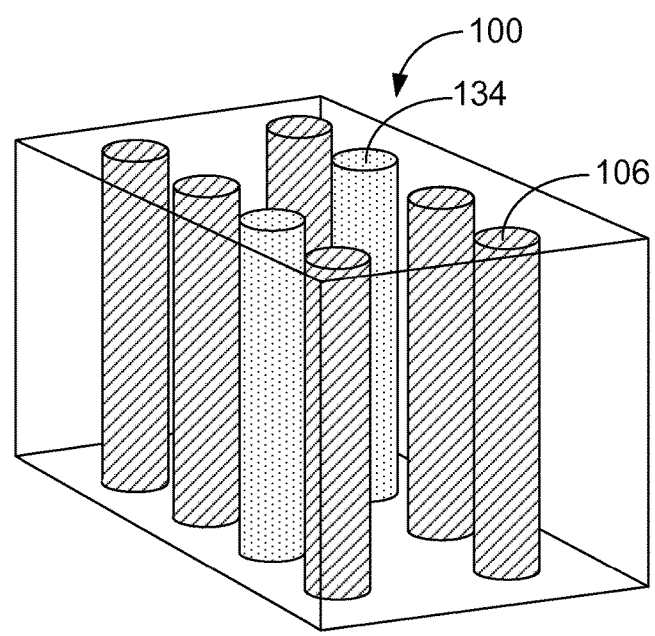

FIGS. 1A-1C show examples of isometric schematic illustrations of glass via bars. FIG. 1A shows an example of a glass via bar 100 including through-glass vias 106. The glass via bar 100 has a length L, a width W and a height H. (It should be noted that the geometry is not shown to scale with the height expanded for the purposes of illustration.) Example dimensions of the glass via bar 100 include a length L between about 1 mm and 6 mm, a width W between about 1 mm and 6 mm, and a height H between about 300 microns and 700 microns. In implementations in which the glass via bar 100 is to be packaged in a mold structure as described below with respect to FIGS. 6 and 7, the height H can be the equal to the thickness of the mold structure. In some implementations, the length and width of the glass via bar can be larger, for example, up to about 15 mm. While the glass via bar 100 in the example of FIG. 1A and the remaining Figures is a rectangular cuboid, the glass via bar 100 may have any shape. For example, the glass via bar 100 may have a 3-D L-shape, a cylindrical shape, or other shape appropriate for a particular package layout, with dimensions on the order of about 1 mm to 15 mm. Moreover, although it is depicted as transparent in the associated Figures, the glass via bar 100 may be transparent or non-transparent. The glass via bar can be a borosilicate glass, a soda lime glass, quartz, Pyrex, or other suitable glass material. In some implementations, the glass substrate is a borosilicate glass substrate that can be ablated by laser radiation. In some implementations, the glass substrate is a photo-patternable glass substrate.

The through-glass vias 106 extend through the glass via bar 100, providing conductive pathways between opposing faces. Example diameters of the glass vias 106 can range from about 30 microns and 100 microns. The through-glass vias 100 can also have any appropriate shape. For example, in certain implementations, via openings for through-glass vias 100 can be circular, semi-circular, oval, rectangular, polygonal, rectangular with rounded edges, polygonal sharp edges, or otherwise shaped. Also according to various implementations, the through-glass vias 100 can have linear or curved sidewall contours. The glass via bar 100 can include any number of through-glass vias placed or arrayed in any regular or irregular arrangement. For example, the glass via bar 100 may have between about 1 and 24 through-glass vias

106. Example pitches (center-to-center distances) of the through-glass vias 106 in the glass via bar can range from about 40 microns to about 200 microns. In some implementations, the through-glass via bars 106 have pitches equal to or less than about 100 microns.

In some implementations, the glass via bar 100 may include partially filled or unfilled through-glass via holes. FIG. 1B shows an example of a glass via bar 100 including through-glass vias 106 and unfilled through-glass via holes 132, which can be formed into through-glass vias by the addition of conductive material. In some implementations, the through-glass via bar may be provided with an arrangement of through-glass via 106 and unfilled through-glass via holes 132 for a particular packaging layout. The unfilled through-glass via holes 132 can facilitate large scale production of the glass via bars 100 without wasting conductive material not used for the particular layout. In some implementations, the glass via bar 100 may include through-glass via holes filled with a non-conductive material. FIG. 1C shows an example of a glass via bar 100 including through-glass vias 106 and filled non-conductive via holes 134. In some implementations, the filled non-conductive via holes 134 can be filled with a thermally conductive filler material. The thermally conductive filler material may serve as a thermally conductive path to transfer heat from devices on one side of the glass via bar 100 to the other. In some implementations, the filled non-conductive via holes 134 can be filled with a filler material that seals the via holes to prevent transfer of liquids or gases through the via holes. In some implementations, the filled non-conductive via holes 134 can be filled with a filler material that provides mechanical support and/or stress relief to the glass via bar 100. In some implementations (not shown), the glass via bar 100 may include through-glass via holes conformally coated with a conductive material. The interior of the through-glass via holes can be left unfilled or filled with a non-conductive material as described above.

Figure 2:
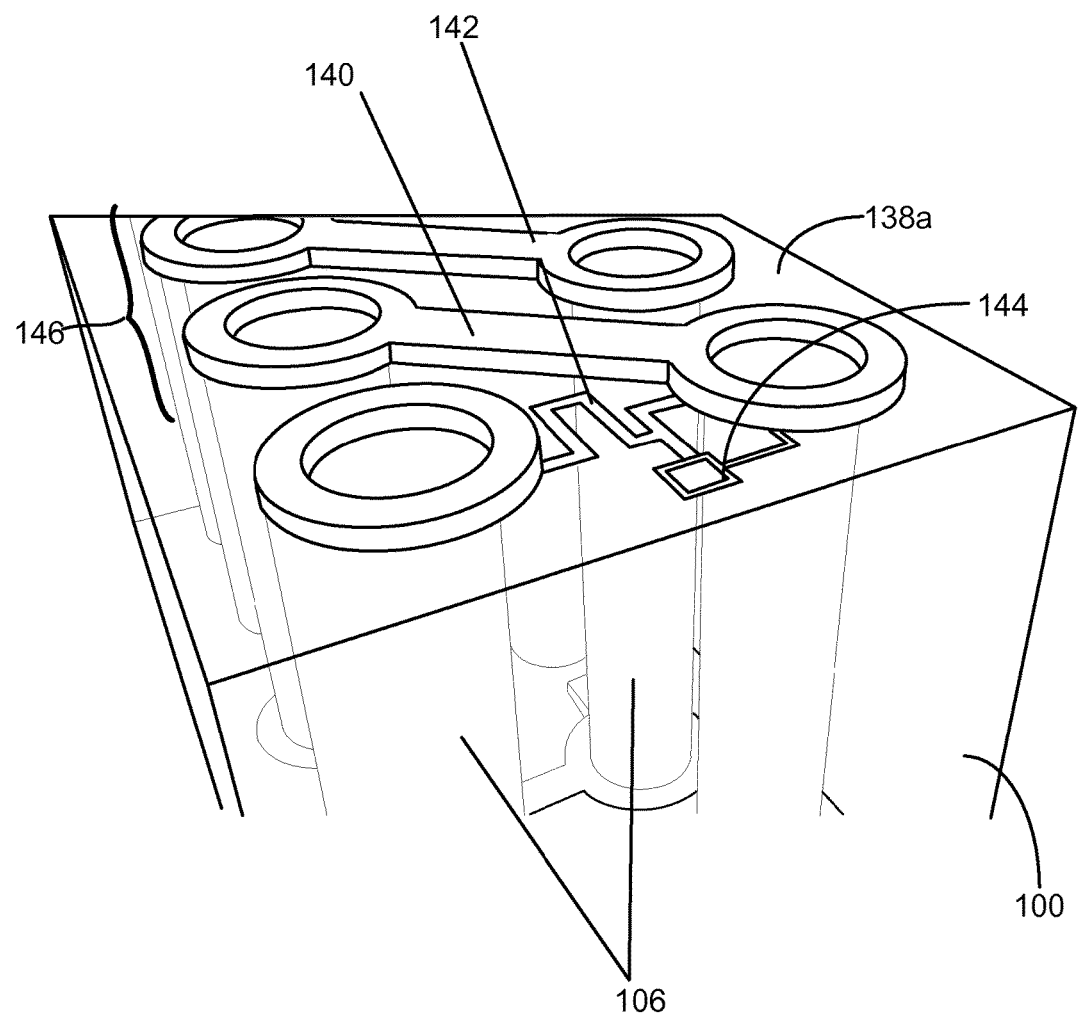
FIG. 2 shows an example of an isometric schematic illustration of a portion of a glass via bar including passive components.

In some implementations, the glass via bar 100 is provided with conductive routing on one or more of its faces. In some implementations, the glass via bar 100 is provided with one or more integrated passive components. An integrated passive component is a passive component provided on one or more of faces or embedded within the glass via bar 100. FIG. 2 shows an example of an isometric schematic illustration of a portion of a glass via bar including passive components. The glass via bar 100 includes a top surface 138a and through-glass vias 106 that extend through the glass via bar 100. Passive components including a capacitor 144 and a resistor 142 can be formed on the top surface 138a. Plated conductive routing 140 also can be formed on the surface 138a. In some implementations, multiple through-glass vias 106 can be connected to form a solenoid-type inductor, or a circular or elongated torroid-type inductor. In the example of FIG. 2, a portion of a solenoid inductor 146 formed by connecting multiple through-glass vias 106 on the top surface 138a and the bottom surface (not shown) is depicted. As illustrated, to form the solenoid inductor 146, through-glass vias are connected to diagonally adjacent through-glass vias on the top surface 138a of the glass via bar while through-glass vias are connected to laterally adjacent vias on the bottom surface of the glass via bar, and vice versa.

Figure 3:
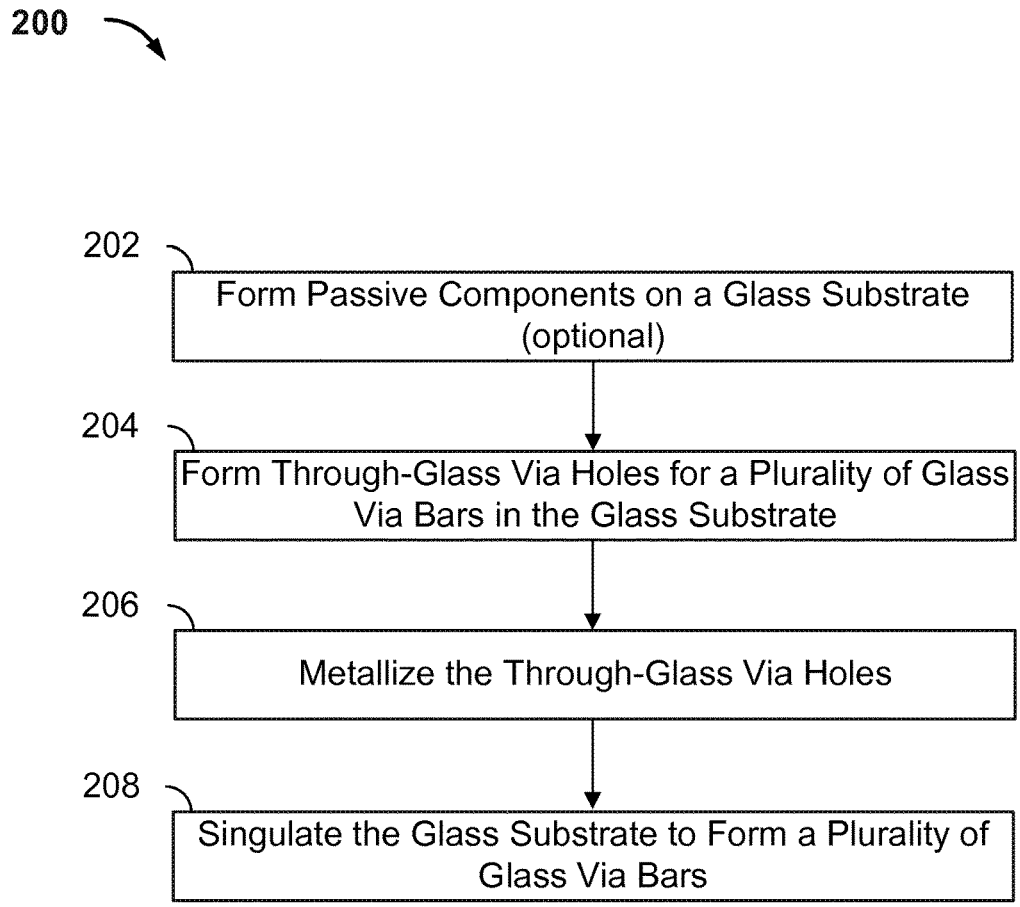
FIG. 3 shows an example of a flow diagram illustrating a batch manufacturing process for glass via bars.

Manufacturing processes for fabricating glass via bars are described below with respect to FIGS. 3-5G. In some implementations, glass via bars can be fabricated in batch level processes. Batch level processes form a plurality of glass via bars simultaneously. FIG. 3 shows an example of a flow diagram illustrating a batch manufacturing process for glass via bars. The process 200 begins at a block 202 with forming passive components for a plurality of glass via bars on one or more surfaces of a glass substrate. The glass substrate can be a panel, sub-panel, wafer, sub-wafer or other appropriate type of substrate. For example, in some implementations, the glass substrate can be a glass plate or panel having an area on the order of four square meters or greater. In some other implementations, the glass substrate can be a round substrate with a diameter of 100 mm, 150 mm, or other appropriate diameter. The thickness of the glass substrate can be the same as the height of the glass via bars that are to be fabricated from the glass substrate. Example thicknesses range from about 300 microns to about 700 microns. In some implementations, the thickness of the glass substrate can be greater than that the glass via bars, if for example, the glass substrate can be thinned in subsequent processing.

The glass substrate may be or include, for example, a borosilicate glass, a soda lime glass, quartz, Pyrex, or other suitable glass material. In some implementations, the glass substrate is a borosilicate glass substrate that can be ablated by laser radiation. In some implementations, the glass substrate can have a coefficient of thermal expansion (CTE) matched to the CTE of another component of a package, or between the CTEs of two or more components of a package. For example, a glass substrate can have a relatively low CTE of about 3.4 ppm/° C. matched to silicon, a relatively high CTE of about 10 ppm/° C. matched to a PCB or mold compound, or a CTE between these components. In some implementations, the glass substrate is a photo-patternable glass substrate. Photo-patternable glasses are discussed further below with respect to FIG. 4.

Forming passive components on one or more surfaces of the glass substrate can include one or more thin film deposition and etching operations. For example, one or more metal, dielectric and passivation layers can be deposited and patterned to form the passive components. Examples of deposition techniques can include PVD, CVD, atomic layer deposition (ALD), electrolytic plating, and electroless plating. In some implementations, the passive components include one or more capacitors, inductors, and/or resistors. In some implementations, the passive components can include a variable capacitor, a varactor, a filter, a transformer, a coupler, a directional coupler, a power splitter, a transmission line, a waveguide and/or an antenna.

The process 200 continues at block 204 with formation of through-glass via holes for a plurality of glass via bars in the glass substrate. Block 204 can involve a sandblasting process, laser ablation process, or photo-patterning process. The process 200 continues at block 206 with metallization of the through-glass via holes to form through-glass vias. Block 206 can include, for example, a plating process such as electroless or electroplating. In some implementations, the through-glass vias can be filled with a metal. In some other implementations, the interior surfaces of the through-glass via holes can be coated with a metal, with the remaining portions of the through-glass via holes left unfilled or filled with a conductive material, such as a metal, or a non-conductive material, such as a dielectric. Block 206 also can include forming one or more routing lines on one or more surfaces of the glass substrate, for example, to electrically connect multiple through-glass vias. In some implementations, block 206 can include filling the through-glass via holes with an electrically conductive paste.

In some implementations, the through-glass vias can be connected to one or more surface passive components and/or interconnected to each other to form, for example, one or more solenoid-type inductors after block 204. In some implementations, some or all of the through-glass vias formed in block 206 and the surface passive components formed in block 202 can be left unconnected after block 206. In some such implementations, the through-glass vias and the passive components can be connected in subsequent processing, for example, during a PoP process.

The process 200 continues at block 208 with singulating the glass substrate to form a plurality of glass via bars, each including through-glass vias and, if formed, surface passive components. Dicing can include forming dicing streets along which the glass substrate will be cut and cutting along the dicing streets with a dicing saw or laser. According to various implementations, the lateral dimensions of the glass via bars formed in block 208 can be between about 1 mm and 15 mm, for example between about 1 and 6 mm.

Figure 4:
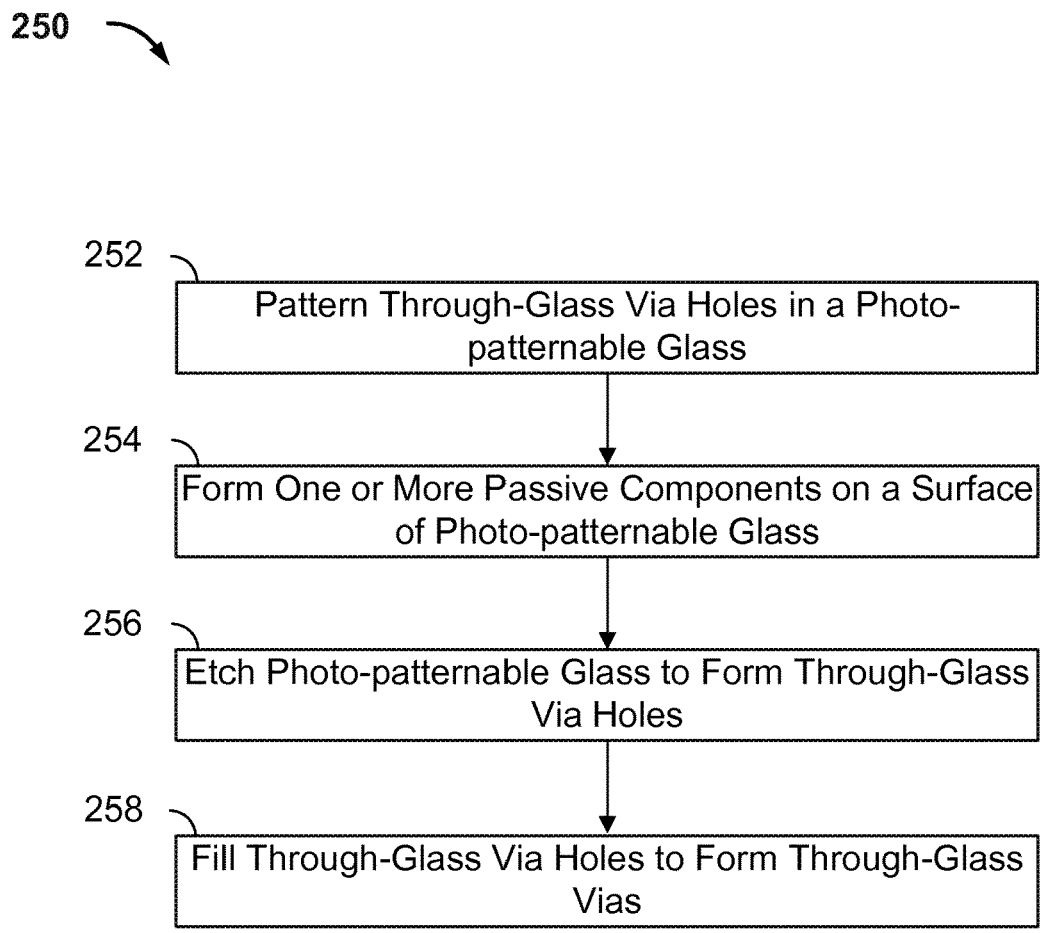
FIG. 4 shows an example of a flow diagram illustrating a manufacturing process for a glass via bar using photo-patternable glass.

FIG. 4 shows an example of a flow diagram illustrating a manufacturing process for a glass via bar using photo-patternable glass. FIGS. 5A-5G show examples of cross-sectional schematic illustrations of various stages in a method of making a glass via bar. First turning to FIG. 4, the process 250 begins at block 252 with patterning through-glass via holes in a photo-patternable glass. In some implementations, "patterning" can refer to changing the chemical or crystalline structure of the photo-patternable glass to form altered regions and un-altered regions. Photo-patternable glasses can include silicon oxide/lithium oxide ($SiO_2/Li_2O$)-based glasses doped with one or more noble metals such as silver (Ag) and cerium (Ce). Treating the photo-patternable glass with electromagnetic radiation and heat can result in chemical reactions that render the glass etchable with etchants such as hydrofluoric (HF) acid. Examples of photo-patternable glasses include APEX™ glass photo-definable glass wafers by Life BioScience, Inc. and Forturan™ photo-sensitive glass by Schott Glass Corporation. Patterning the photo-patternable glass can include masking the glass to define the through-glass via holes and exposing the unmasked portions of the glass body to ultraviolet (UV) light and thermal annealing. Examples of mask materials can include quartz-chromium. The UV exposure can change the chemical composition of the unmasked portions such that they have high etch selectivity to certain etchants. For example, in some implementations, a masked glass is exposed to UV light having a wavelength between 280 and 330 nanometers. Exposure to UV light in this range can cause photo-oxidation of $Ce^{3+}$ ions to $Ce^{4+}$ ions, freeing electrons. $Ag^+$ ions can capture these free electrons, forming Ag atoms. In some implementations, a two-stage post-UV exposure thermal anneal can be performed. In the first stage, Ag atoms can agglomerate to form Ag nanoclusters. In the second stage, crystalline lithium silicate ($Li_xSiO_3$) forms around the Ag nanoclusters. The masked regions of the glass are chemically unchanged and remain amorphous. Thermal anneal temperatures can range from about 500° C. to about 600° C., with the second stage performed at a higher temperature than the first stage. The crystalline portions of the glass can be etched in subsequent processing, for example in block 256, while leaving the vitreous amorphous portions substantially unetched.

The above-described process is one example of patterning a photo-patternable glass, with other processes possible. In some implementations, for example, the glass may include Al, Cu, boron (B), potassium (K), sodium (Na), zinc (Zn), calcium (Ca), antimonium (Sb), arsenic (As), gold (Au), magnesium (Mg), barium (Ba), lead (Pb), or other additives in addition to or instead of the above-described components.

In some implementations, the photo-patternable glass may include various additives to modify melting point, increase chemical resistance, lower thermal expansion, modify elasticity, modify refractive index or other optical properties, or otherwise modify the characteristics of the glass. For example, potassium oxide ($K_2O$) and/or sodium oxide ($Na_2O$) may be used to lower the melting point and/or increase chemical resistance of the photo-patternable glass and zinc oxide (ZnO) or calcium oxide (CaO) may be used to improve chemical resistance or reduce thermal expansion. In some implementations, one or more other electron donors may be used in addition to or instead of Ce. In some implementations, the photo-patternable glass may include one or more oxygen donors.

Example UV dosages can range from 0.1 $J/cm^2$ to over 50 $J/cm^2$. The UV wavelength and dosage can vary according to the composition and size of the photo-patternable glass. The UV-induced chemical reactions can also vary depending on the chemical composition of the photo-patternable glass, as can the subsequent thermal-induced reactions. Moreover, in some implementations, these reactions may be driven by energy sources other than UV radiation and thermal energy, including but not limited to other types of electromagnetic radiation. In general, treating the unmasked areas of the photo-patternable glass with one or more types of energy produces can produce crystalline composition such as polycrystalline ceramic. The conversion to a crystalline ceramic allows the photo-patternable glass to be etched.

Figure 5A:
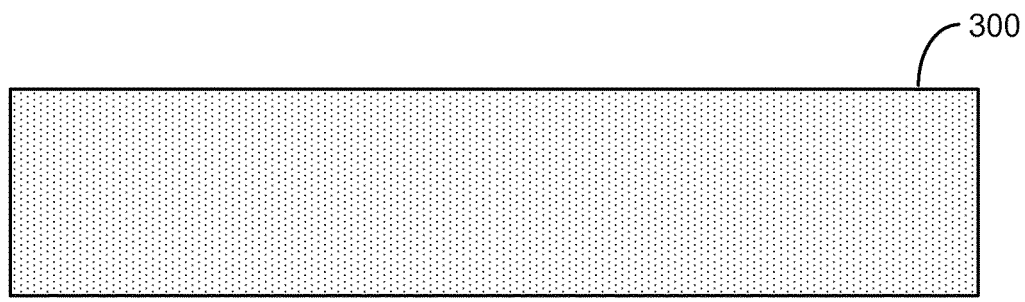
FIGS. 5A-5G show examples of cross-sectional schematic illustrations of various stages in a method of a making a glass via bar.
Figure 5B:
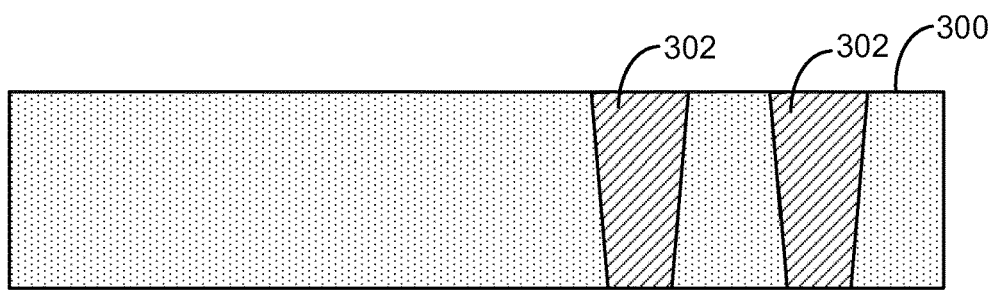

FIG. 5A shows an example of a cross-sectional schematic illustration of a photo-patternable glass prior to patterning. Glass substrate 300 is a photo-patternable glass and can be, for example, a $SiO_2/Li_2O$-based glass as described above, and can have a thickness for example, between about 300 microns and 700 microns. In some implementations in which the glass via bars are formed as part of a batch process as described above with respect to FIG. 3, the depicted portion of the glass substrate 300 can be one repeat unit of a larger glass panel or wafer. FIG. 5B shows an example of a cross-sectional schematic illustration of the photo-patternable glass after patterning, for example, after block 252 in FIG. 4. The glass substrate 300 includes crystalline portions 302, which extend through the thickness of the glass substrate 300 and that will eventually be etched to form through-glass via holes. In the example of FIG. 5B, the crystalline portions 302 have a slightly angled profile. Accordingly to various implementations, the crystalline portions 302, and thus the through-glass via holes, can have substantially straight sidewalls with an angle ranging from about 80° to about 90° from the top surface of the photo-patternable glass.

Figure 5C:
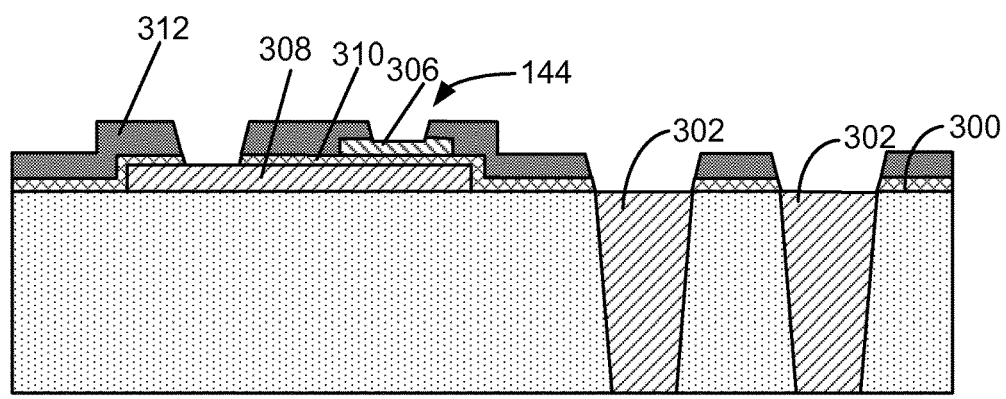

Returning to FIG. 4, the process 250 continues at a block 254 with forming one or more passive components on a surface of the photo-patternable glass. As described above with respect to FIG. 3, forming one or more passive components can include thin film deposition and patterning operations. FIG. 5C shows an example of a cross-sectional schematic illustration of a photo-patternable glass including a capacitor formed on a surface of the photo-patternable glass. The capacitor 144 includes metal layers 306 and 308 and dielectric layer 310. The dielectric layer 310 and a passivation layer 312 cover the amorphous portions of the glass substrate 300. Contact points to each of the metal layers 306 and 308 are patterned. Examples of metal layers can include but are not limited to Al, Mo, Cu, and alloys and combinations thereof, such as aluminum niodymium (AlNd) and aluminum copper (AlCu). Examples of dielectric materials can include but are not limited to $SiO_2$, silicon oxynitrides, zirconium oxide (ZrO), aluminum oxides (AlO$_x$) including Al$_2$O$_3$, and laminated dielectrics.

Returning to FIG. 4, the process 250 continues at a block 256 with etching the photo-patternable glass to form through-glass via holes. Any etch chemistry having a substantially higher etch selectivity for the crystalline portions 302 of the glass substrate 300 than the amorphous portions of the glass substrate 300 can be used, including wet and dry etching. In one example, 10% HF solution can be employed for wet etching. In another example a fluorine-based dry etch can be employed, using a chemistry such as XeF$_2$, tetrafluoromethane (CF$_4$) or sulfur hexafluoride (SF$_6$). The etchant exposure time is long enough such that the photo-patternable glass is etched through its thickness, forming the through-glass via holes. In some implementations, the etch is followed by a post-etch bake.

Figure 5D:
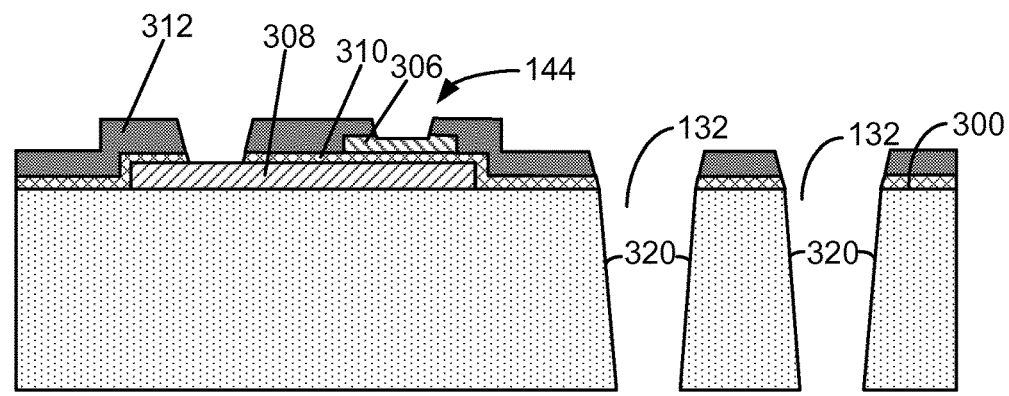

FIG. 5D shows an example of a cross-sectional schematic illustration of a glass substrate after etch of through-glass via holes. The amorphous portions of the glass substrate 300 remain, with the crystalline portions etched away to form through-glass via holes 132. In alternate implementations, the through-glass via holes 132 can be formed by laser ablation of a laser-ablatable glass substrate. The through-glass via holes 132 include interior surfaces 320, also referred to as sidewall surfaces.

The process 250 continues at block 258 with filling the through-glass via holes 132. In some implementations, block 258 can include forming a seed layer on an interior surface of the through-glass via holes, followed by plating to fill the through-glass via holes. A seed layer may be deposited by a process such as PVD, CVD, ALD, or an electroless plating process. In some implementations, the seed layer may include titanium nitride (TiN), ruthenium-titanium nitride (Ru—TiN), platinum (Pt), palladium (Pd), Au, Ag, Cu, nickel (Ni), Mo, or tungsten (W). In some implementations, the through-glass via holes are filled by electroplating. Examples of plated metals can include Cu, Ni, Au, and Pd, and alloys and combinations thereof. In some implementations, block 250 can further include patterning one or more of the top and bottom surfaces of the glass to electrically isolate the through-glass vias and/or passive components, form routing and contacts to the through-glass vias and/or passive components, interconnect multiple through-glass vias to form solenoid-type inductors, and the like.

Figure 5E:
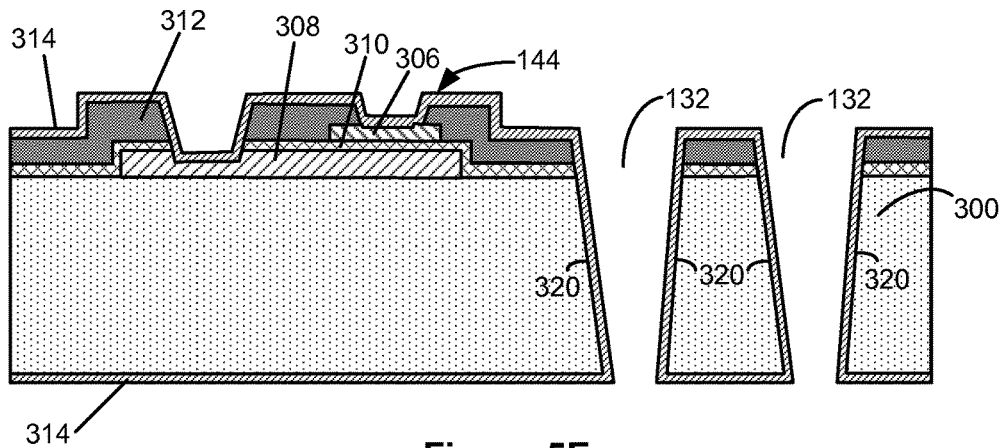
Figure 5F:
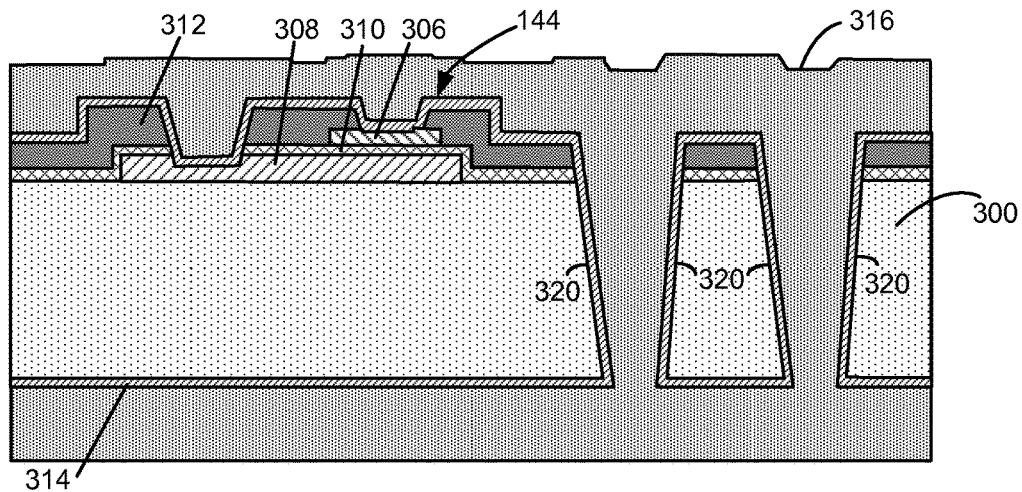

FIG. 5E shows an example of a cross-sectional schematic illustration of a glass substrate after through-glass via hole sidewall and surface metallization. The exposed surfaces of the structure in FIG. 5E, including the interior surfaces 320 of the through-glass via holes 132, the exposed surfaces of the metal layers 306 and 308, and the passivation layer 312 are conformally coated with a seed layer 314. FIG. 5F shows an example of a cross-sectional schematic illustration of a glass substrate after plating to fill the through-glass via holes. A plated metal 316 fills the through-glass via holes 132 shown in FIG. 5E, and covers the conformal seed layer 314. As described above, the plated metal 316 can be patterned in a subsequent operation, as shown in FIG. 5G.

Figure 5G:
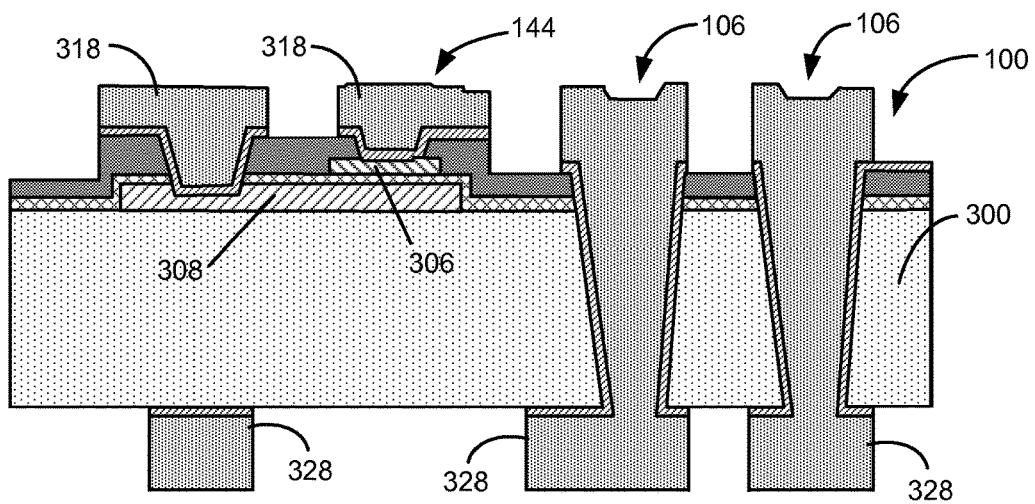

FIG. 5G shows an example of a cross-sectional schematic illustration of a glass via bar including through-glass vias and a passive component. The glass via bar 100 includes through-glass vias 106 formed in a glass substrate 300 and a capacitor 144 formed on a surface of the glass substrate 300. The glass via bar 100 also includes plated contacts 318 to metal layers 306 and 308 of the capacitor 144. In some implementations, the glass via bar 100 can be configured to be attached to a printed circuit board (PCB) or other organic substrate at plated areas 328. In some implementations, the glass via bar 100 can be attached to the PCB or other organic substrate by soldering with solder balls. In some implementations, the glass via bar 100 can attached to the PCB or other organic substrate by soldering solder or a solderable metal disposed on the tips of the through-glass vias 106.

In some implementations (not shown), a conformal metal can be plated or otherwise formed on the conformal seed layer 314. The interior of the through-glass via holes 132 can be left unfilled or filled with a non-conductive material as described above with reference to FIG. 1C. Also, in some other implementations (not shown), the through-glass vias 106 can be formed by filling the through-glass via holes 132 with a conductive paste, such as a copper (Cu) or Ag conductive paste. According to various implementations, a conformal conductive layer, such as the conformal seed layer 314, may or may not be formed prior to filling the through-glass via holes 132 with the conductive paste.

Figure 5H:
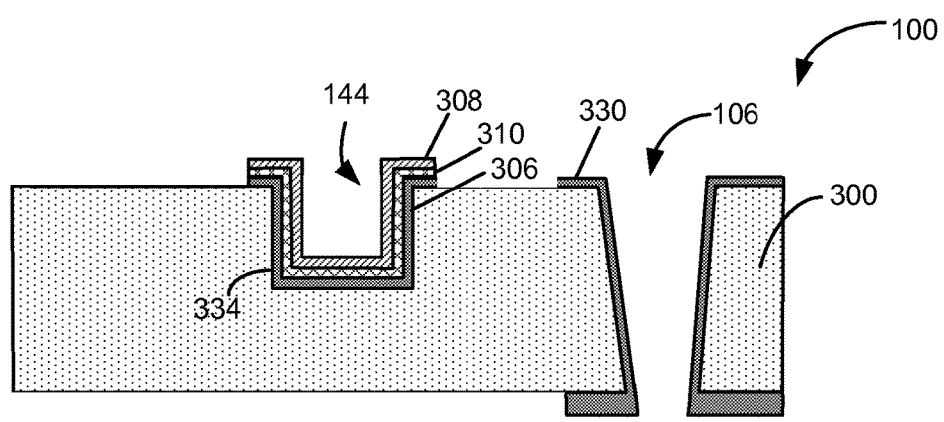
FIG. 5H shows an example of a glass via bar including an integrated capacitor formed in a trench.

In some implementations, integrated capacitors or other passive components can be formed in trenches or holes formed in the glass via bar. For example, as noted above with reference to FIG. 2, a solenoid-type inductor can be formed by connecting multiple through-glass vias of a glass via bar. FIG. 5H shows an example of a glass via bar including an integrated capacitor formed in a trench. The glass via bar 100 includes a through-glass via 106 and a capacitor 144 formed in a glass substrate 300. The through-glass via 106 includes a conformal conductive film 330. The capacitor 144 is formed in a trench 334 formed in the glass substrate 300 and includes metal layers 306 and 308 and dielectric layer 310. The trench 334 can be formed in the glass substrate 300 by photo-patterning or laser ablation as described above and may also be referred to as a blind via hole. In some implementations (not shown), capacitors or other passive components can be formed in through-glass holes in addition to or instead of in trenches. Passive components in trenches or holes in a substrate can be formed using deposition processes such PVD, CVD, and ALD, plating processes, and etch processes.

Examples of methods of forming metal-insulator-metal (MIM) capacitors on interior surfaces of a glass substrate are described in U.S. patent application Ser. No. 13/686,620, titled "Adhesive Metal Nitride on Glass and Related Methods," filed Nov. 27, 2012, incorporated by reference herein. As described therein, forming MIM capacitors can involve forming metal nitride layers that act as electrode layers of a MIM capacitor and/or adhesive or diffusion barrier layers for a MIM capacitor. For example, in some implementations, an adhesive metal nitride layer can be formed on the glass surface of a trench formed in a glass substrate. The adhesive metal nitride layer can serve as a seed layer for subsequently deposited thin films. In some implementations, a dielectric layer can be formed over the adhesive metal nitride layer such that it that substantially conforms to the adhesive metal nitride layer within the trench and over a portion of the surface of the glass substrate. An outer metal nitride layer can be formed over the dielectric layer such that it substantially conforms to the dielectric layer within the trench and over a portion of the surface of the glass substrate. The adhesive metal nitride layer, the dielectric layer, and the outer metal nitride layer can form part of a MIM capacitor in the trench, with the metal nitride layers acting as electrodes of the MIM capacitor. Examples of metal nitride layers include TiN and tantalum nitride (TaN) layers. Each of the adhesive metal nitride layer, the dielectric layer, and the outer metal nitride layer can be formed by ALD in some implementations. In some implementations, metal layers such as Cu layers can be formed between the dielectric layer and each of the metal nitride layers. The metal layers can be formed using electroless and/or electrolytic plating techniques, for example. The metal layers, the adhesive metal nitride layer, the outer metal nitride layer, and the dielectric layer can form part of a MIM capacitor in the trench, with the metal layers acting as electrodes of the MIM capacitor. The outer metal nitride layer can serve as a diffusion barrier to reduce the migration of metal atoms into the dielectric layer.

As indicated above, in some implementations, the glass via bars described herein can be part of a package-on-package (PoP). PoP processes involve packaging multiple dies in separate packages, then packaging the separate packages together by stacking package-on-package. Two or more packaged dies including logic, memory, analog, RF, and EMS dies can be packaged together in a PoP. For example, in some implementations, a logic die can be packaged with a memory die.

Figure 6:
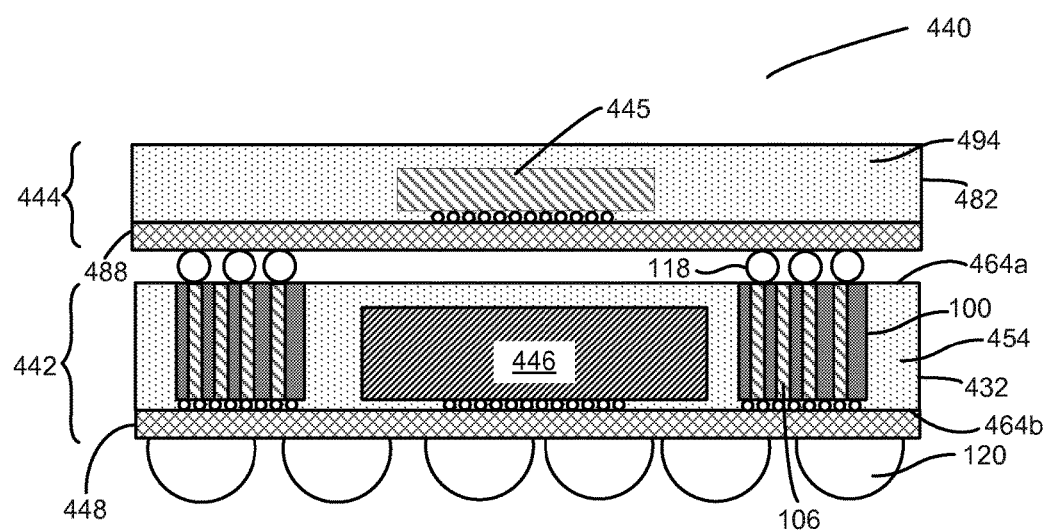
FIG. 6 shows an example of a schematic cross-sectional illustration of a package-on-package (PoP) that includes glass via bars.

A PoP includes one or more separately packaged dies stacked together. FIG. 6 shows an example of a cross-sectional schematic illustration of a PoP that includes glass via bars. In the Figure and associated description, reference is made to PoPs that include two packages, a bottom package and an upper package. However, a PoP can include any number of stacked individually packaged dies, including three or more dies.

FIG. 6 shows an example of a schematic cross-sectional illustration of a PoP that includes glass via bars. The PoP 440 includes a bottom package 442 vertically integrated with an upper package 444. The PoP 440 can be further mounted on an electronic device PCB (not illustrated) via inter-level interconnects 120. An example of an electronic device PCB is a PCB for a mobile telephone. In the example of FIG. 6, the bottom package 442 can be a logic package including one or more logic dies and the upper package 444 can be a memory package including one or more memory dies. However, each of the packages in a PoP can independently include any appropriate type of die, with any appropriate stacking arrangement employed. In some implementations that employ logic and memory packages, the logic package is the bottom package as it typically uses a higher density of connections to an underlying PCB.

The bottom package 442 includes a mold structure 432 and a bottom package substrate 448. The mold structure 432 has a top surface 464a and a bottom surface 464b and includes a mold compound 454 as well as components embedded within the mold compound 454; in the example of FIG. 6, these components include a bottom package die 446 and glass via bars 100. Each of the glass via bars 100 includes through-glass vias 106 that extend through the thickness of the glass via bar 100 and provide electrical connections from the top surface 464a of the mold structure 432 to the bottom surface 464b. While the mold structure 432 in the example of FIG. 6 includes a single die, an arbitrary number of dies can be included according to various implementations. In some implementations, the bottom package die 446 is a logic die, for example an application processor for a smartphone, digital camera, or other electronic device.

The bottom package substrate 448 can be an organic substrate, such as a polymeric substrate or PCB, that can include conductive pathways (not shown) and contact pads (not shown). The through-glass vias 106 can be electrically connected to the bottom package die 446 by electrical routing on the bottom surface 464b of mold structure 432 and/or electrical routing in or on the logic package substrate 448. Conductive pathways and contacts pads in or on bottom package substrate 448 can provide an electrical connection from the bottom package 442 to the inter-level interconnects 120. The through-glass vias 106 can provide an electrical connection to the inter-level interconnects 118, which connect the bottom package 442 to the upper package 444. In some implementations, a redistribution layer (not shown) may be included on or attached to the top surface 464a of the mold structure 432 to provide an electrical connection to the inter-level interconnects 118. In the example of FIG. 6, the bottom package die 446 and the through-glass vias 106 are electrically connected to the bottom package substrate 448 by flip-chip attachment, which in turn provides an electrical connection to inter-level interconnects 120. If present, a redistribution layer may be formed directly on the mold structure 432 with electrical connections to the through-glass vias 106 embedded in the mold structure 432 or may be electrically connected to the through-glass vias 106 via solder balls or other electrical attachment disposed between the redistribution layer and the mold structure 432.

The upper package 444 includes a mold structure 482 and an upper package substrate 488. The upper package substrate 488 can be an organic substrate, such as a polymeric substrate or PCB. The mold structure 482 includes a mold compound 494 and components embedded within the mold compound 494; in the example of FIG. 6, these components include an upper package die 445. The upper package die 445 can include a single memory die or a stack of multiple memory dies, for example. In the example of FIG. 6, the upper package die 445 is electrically connected to the upper package substrate 488 by flip-chip attachment, which in turn provides an electrical connection to inter-level interconnects 118. In some other implementations, one or more dies can be wire bonded or otherwise connected to the upper package substrate 448.

It should be noted that the size, pitch, and placement of the inter-level interconnects 118 and the inter-level interconnects 120, as well as of the flip-chip attachments of the upper package die 445, the bottom package die 446, and the through-glass via bars 100 can be varied as appropriate. For example, the size and/or pitch of solder balls that connect the through-glass via bars 100 to the bottom package substrate 448 may be the same as the inter-level interconnects 118.

In some implementations, the glass via bars 100 can include one or more integrated capacitors (not shown) as described above with reference to FIGS. 4-5H. Because the capacitors are integrated with the glass via bars 100, the glass via bars 100 and the capacitors can be placed closer to the bottom package die 446 than if the capacitors were discrete components, reducing path length and increasing efficiency. In addition to reducing the path length, the glass via bars 100 can reduce the footprint of the bottom package 442 and the footprint of the PoP 440. The integrated capacitors on the glass via bars 100 may be connected to one or more of the glass vias, or unconnected. In implementations where the integrated capacitors are unconnected to any glass via, the glass via bars 100 may be configurable and an electrical connection may be formed as needed during or before assembling the PoP. Configurable glass via bars are described in U.S. patent application Ser. No. 13/566,925, titled "Passives Via Bar," filed Aug. 3, 2012, incorporated by reference herein. In some other implementations, the bottom package 442 can include one or more capacitors or other passive components instead of or in addition to passive components integrated on the through-glass via bars 100.

In the example of FIG. 6, only the bottom package includes the glass via bars 100. However, according to various implementations, any one of the packages in a PoP can include glass via bars. For example, the upper package 444 may include glass via bars to connect to a third package (not shown) stacked on top of the upper package 444.

As noted above, in some implementations, a PoP can include a packaged memory die stacked with a packaged logic die. In some such implementations, integrated capacitors and/or other passive components allow the via interconnects to be located nearer to the logic die than if discrete passive components are located between the logic die and the via interconnects. In some implementations, the footprint of a logic package can be reduced by the increased density of the via interconnects enabled by the glass via bar. The footprint of a logic package can be about 5% to about 20% greater than the footprint occupied by the glass via bars in the package, for example. In some implementations, a logic package can have lateral dimensions of 10 mm or less, for example. Other types of packages can also be similarly scaled down. The footprint of the memory package can be reduced by including a memory die stack attached to the memory package substrate by flip-chip attachment rather than by wire bonds. Further, in some implementations, a stacked memory architecture including through-silicon vias (TSVs) can be employed to reduce the memory package footprint. For example, a PoP can include a wide I/O memory die.

Figure 7:
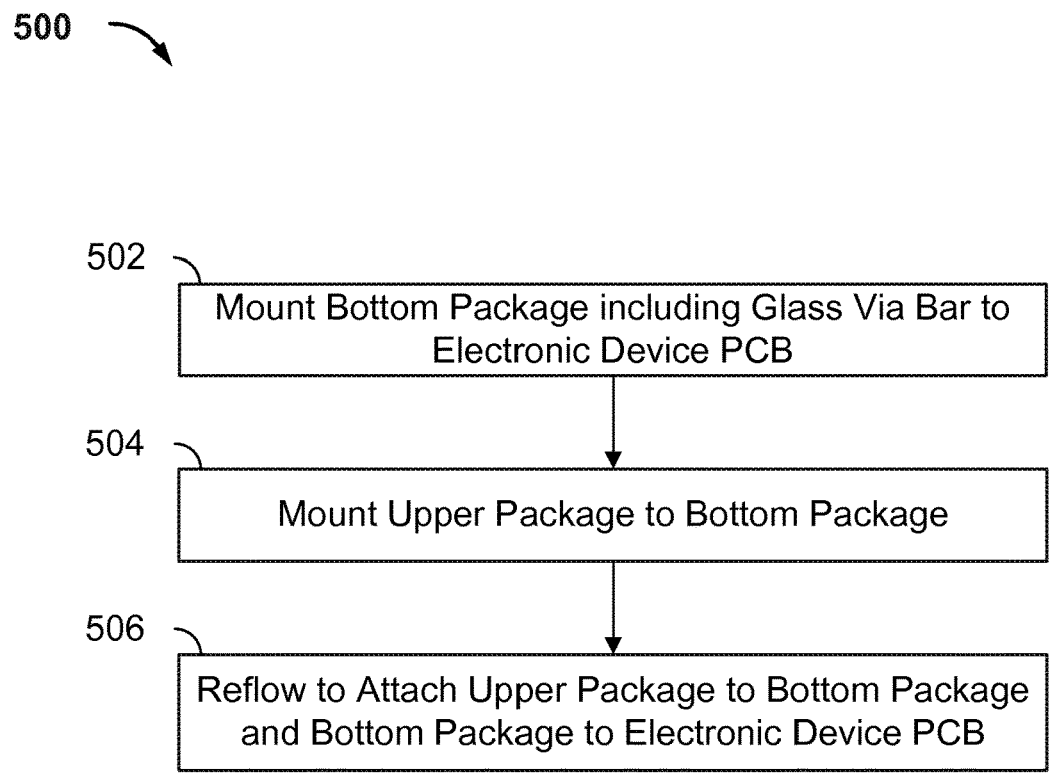
FIGS. 7-11 show examples of flow diagrams illustrating PoP processes employing glass via bars.
Figure 8:
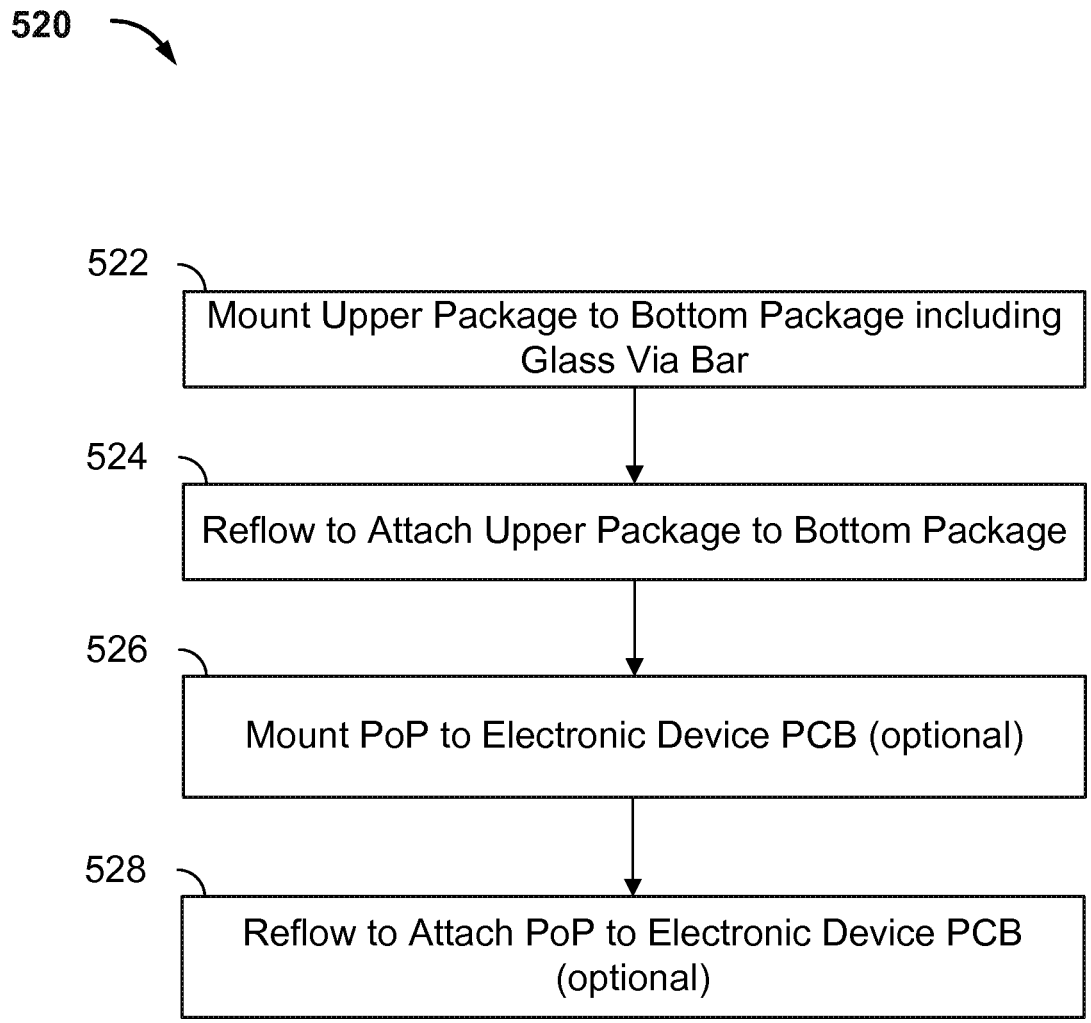

FIGS. 7-11 show examples of flow diagrams illustrating PoP processes employing glass via bars. Once two or more discrete packages to be incorporated in a PoP are formed, they can be stacked to form a PoP. FIGS. 7 and 8 show examples of stacking two packages, a bottom package and an upper package. In the examples, the bottom package includes a glass via bar as described above with respect to FIG. 6. However, an upper package may include a glass via bar in addition to or instead of the bottom package.

First turning to FIG. 7, the process 500 begins at block 502 with mounting the bottom package, which includes a glass via bar and a bottom package substrate, to an electronic device printed PCB, such as a PCB for a mobile telephone, tablet, or computer. Forming a bottom package including a glass via bar is described further below with respect to FIGS. 9-11. Mounting the bottom package on the electronic device PCB can involve positioning the bottom package such that inter-level interconnects (for example, solder balls) on its bottom surface are aligned and in contact with corresponding contact pads on the electronic device PCB. The process 500 continues at block 504 with mounting the upper package, including an upper package substrate, to the bottom package. Block 504 can involve positioning the upper package such that inter-level interconnects on its bottom surface are aligned and in contact with corresponding contacts on the bottom package. According to various implementations, these contacts can include the through-glass vias or contact pads electrically connected to the through-glass vias. One or additional packages can then be included in the stack by mounting on the previously-mounted package (not shown). Once all packages are stacked in this fashion, the process 500 continues at block 506 with reflowing solder to simultaneously attach the bottom package to the electronic device PCB and the upper package to the bottom package.

FIG. 8 shows an example of stacking two packages, a bottom package and an upper package in which the upper package is attached to the bottom package prior to attachment to an electronic device PCB. The process 520 begins at block 522 with mounting the upper package to the bottom package as described above with respect to block 504 of FIG. 7. One or additional packages can then be included in the stack by mounting on the previously-mounted package (not shown). Once all packages are stacked in this fashion, the process 520 continues at block 524 with reflowing solder to attach the upper package to the bottom package. If additional packages are stacked on the upper package, they are can all be bonded to other packages in the stack during block 524. The bottom package may be supported by a carrier substrate or fixture during blocks 522 and 524. The process 520 can continue at block 526 by mounting the PoP, i.e., the stacked packages, to the electronic device PCB in an optional operation. If performed, block 526 can involve positioning the PoP such that the solder balls or other inter-level interconnects on the bottom surface of bottom package are aligned and in contact with corresponding contact pads on the electronic device PCB. The process 520 can then continue at block 528 with a second reflow operation to attach the PoP to the electronic device PCB in an optional operation.

According to various implementations, reflow processes to attach a PoP to an electronic device PCB can involve a single or multiple reflow operations to attach the PoP in place on the electronic device PBC. If multiple reflow processes are used, in some implementations, a higher temperature solder can be used in the first reflow operation, followed by a reflow operation using a lower temperature solder. In some implementations, a solder that forms an intermetallic composition that does not melt during the second reflow operation can be used in the first reflow operation.

Figure 9:
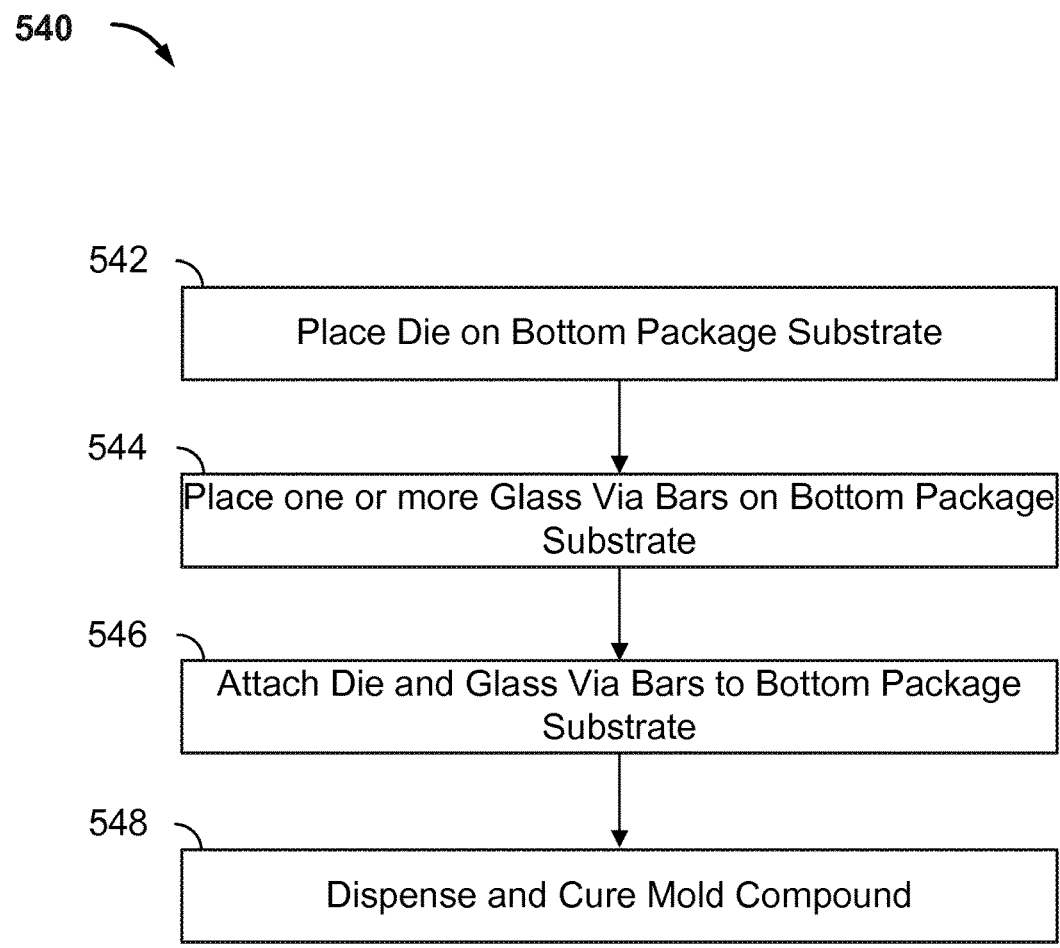
Figure 10:
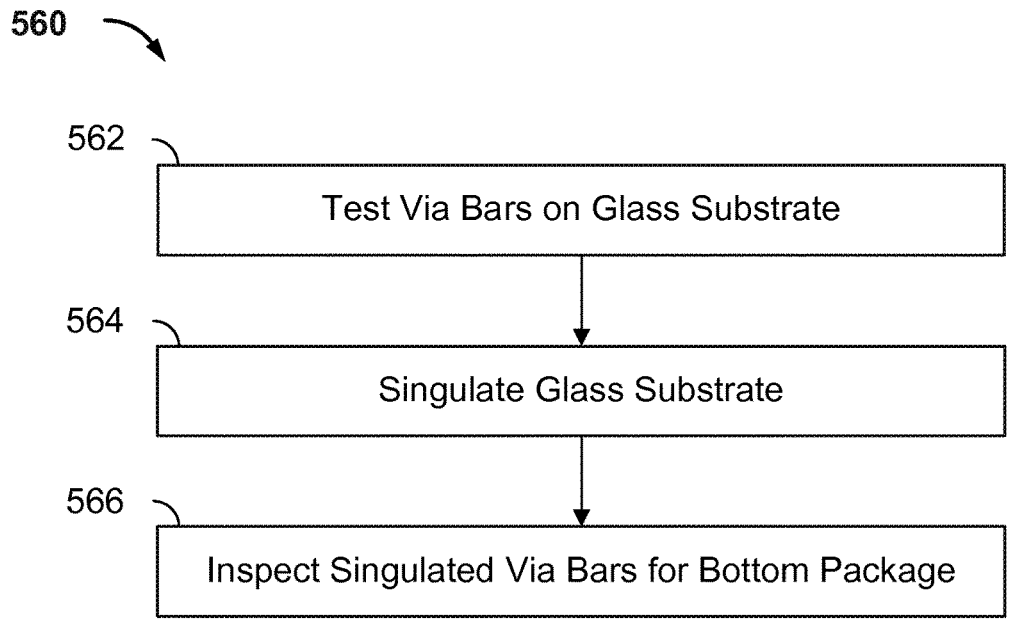
Figure 11:
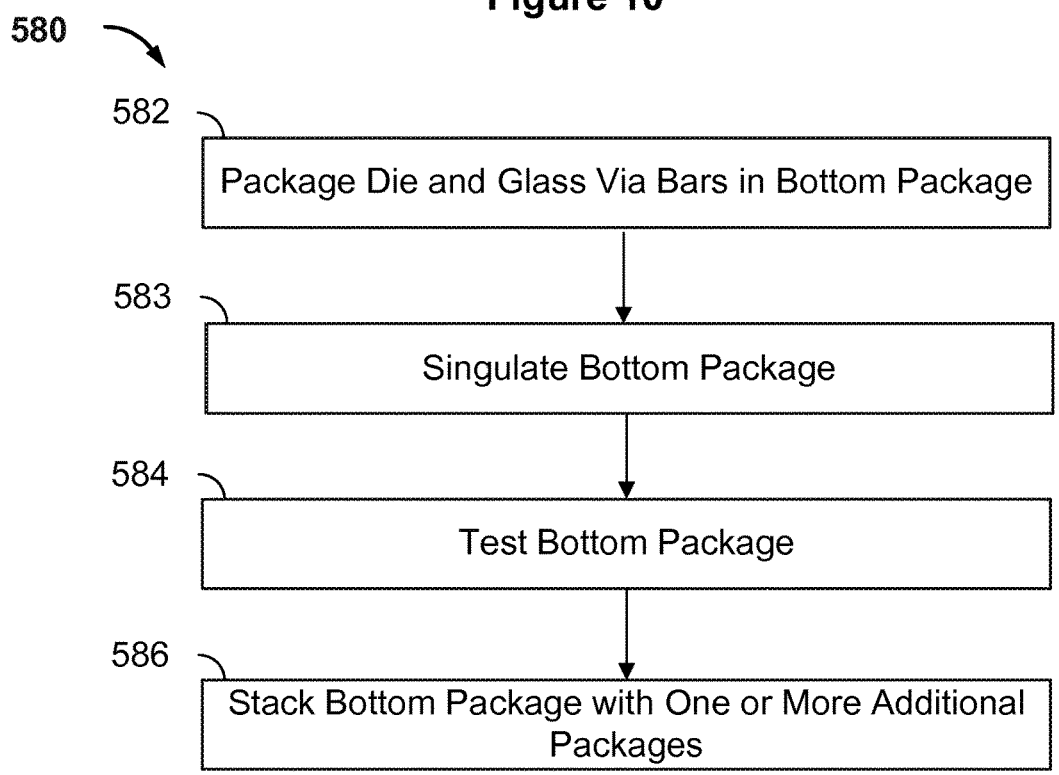

FIGS. 9-11 show examples of flow diagrams illustrating processes for forming a bottom package of a PoP. First, turning to FIG. 9, the process 540 begins at block 542 with placing a die on a bottom package substrate. Examples of dies include but are not limited to application processors. As described further below with respect to FIG. 10, in some implementations, the die is tested prior to block 542. This allows only a known good die to be incorporated into the bottom package and the PoP. The process 500 continues at block 544 with placing one or more glass via bars on the bottom package substrate. The glass via bars can include one or more capacitors or other passive components on one or more surfaces. For a configurable via bar, various passive components may be connected to each other or to one or more glass vias before or after the block 544. As described further with respect to FIG. 11, in some implementations, the glass via bars are tested prior to block 504. This allows only known good via bars to be incorporated in the bottom package and the PoP. Once the die and the one or more glass via bars are placed, they are attached to the bottom package substrate at block 546. The bottom die and the one or more glass via bars can be attached simultaneously to the logic package substrate, for example by solder reflow. The process 540 continues at block 548 with dispensing and curing a mold compound. Additional operations such as solder ball mount, reflow, package singulation, package inspection, and testing can then be performed. Once formed, the bottom package can be stacked with one or more additional packaged dies to form a PoP as described above with reference to FIGS. 7 and 8.

FIG. 10 shows an example of a flow diagram illustrating a process for testing a glass via bar for a bottom package of a PoP. The process 560 begins at block 562 with testing via bars formed in a glass substrate as described above with respect to FIGS. 4-5G. Testing can involve one or more wafer probing and optical inspection operations. Both the through-glass vias and integrated passive components, if present, can be tested. Via bars that do not pass the testing are identified and not used in a bottom package. The process 560 continues at block 564 with singulating the glass substrate to form multiple individual glass via bars. The process 560 continues at block 566 with inspection of the glass via bars to be placed in a bottom package. In this manner, only known good glass via bars are packaged.

The die to be incorporated into a bottom package or upper package for a PoP can similarly be tested, prior to and/or after package singulation. Moreover, in addition to or instead of one or more such testing operations, a bottom package can be tested prior to being packaged in a PoP. FIG. 11 shows an example of a flow diagram illustrating a process for testing a bottom package of a PoP. The process 580 begins at block 582 with packaging a die and glass via bars in a bottom package. Packaging a die and glass via bars in a bottom package is described above with reference to FIG. 9. The process 580 can continue at block 583 with singulating the bottom package and at block 584 with testing the bottom package. Testing can involve one or more wafer probing and optical inspection operations. Probing a bottom package can be easier than probing an unpackaged die, due to the larger size of the package. For example a 300 micron probe may be sufficient to test a package while a 50 micron probe may be sufficient to probe a die. Packages that do not pass the testing are identified and not used in a PoP. The process 580 continues at block 586 with stacking the bottom package with one or more additional packages to form a PoP. The one or more additional packages can be similarly tested. In this manner, only known good packages are incorporated into the PoP.

Figure 12A:
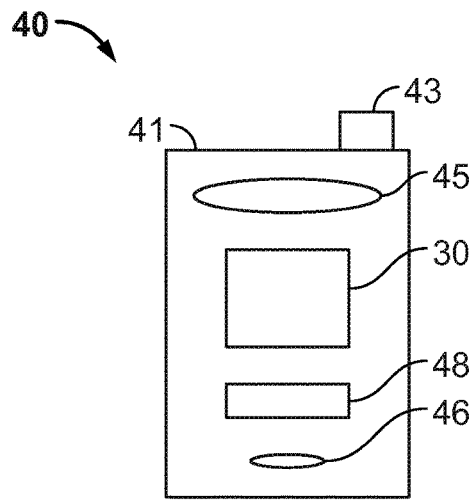
FIGS. 12A and 12B show examples of system block diagrams illustrating a display device that includes a packaged semiconductor chip in electrical connection with a glass via bar.
Figure 12B:
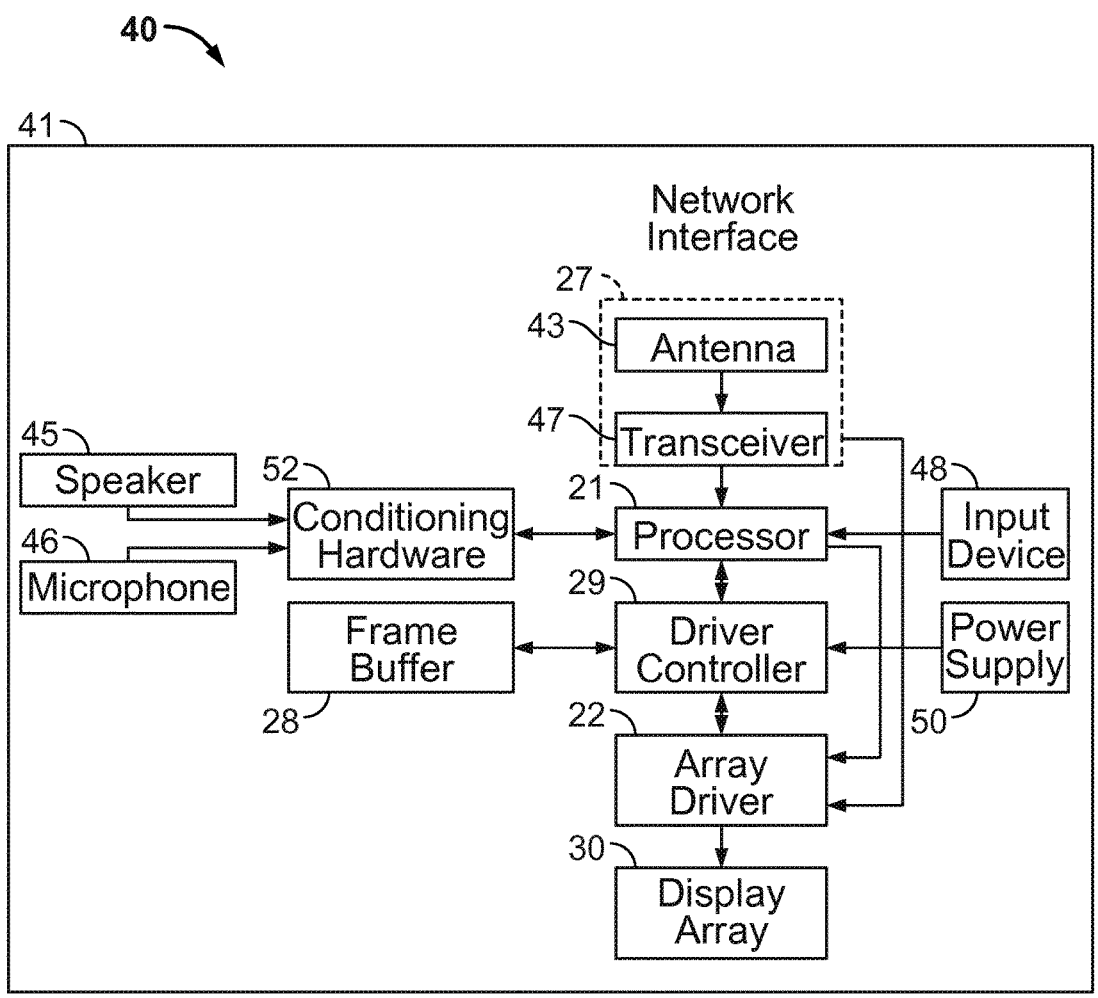

In some implementations, the glass via bar can be included as part of a display device, or in a package including or included in a display device. FIGS. 12A and 12B show examples of system block diagrams illustrating a display device 40. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 12B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The processor 21 may be one of the dies in a PoP stack as described above. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11 a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

In various implementations of the display device 40, one or more of the antenna 43, transceiver 47, processor 21, driver controller 29, frame buffer 28, speaker 45, microphone 46, array driver 22, power supply 50, and input device 48 can include a package with a semiconductor die embedded in a molded die with a glass via bar or a package in which a semiconductor die and a glass via bar are both bonded to the same substrate. For example, the processor 29 may include a PoP package that includes a semiconductor processor die and a glass via bar. As another example, power supply 50 can include a glass via bar configured as a solenoid-type inductor.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus. If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blue-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other possibilities or implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A package-on-package comprising:
    a bottom package vertically integrated with a second package, wherein
    the bottom package includes a first die, a glass via bar, and a package substrate, wherein the first die and the glass via bar are attached to the same side of the package substrate, wherein the first die is oriented laterally to the glass via bar on the package substrate, and wherein the first die and the glass via bar are each electrically coupled to the package substrate by distinct electrical connections;
    the second package includes a second die; and
    the first die is configured to be in electrical communication with the second die through the glass via bar, wherein the glass via bar includes an amorphous silicate glass sidewall surface that extends through a thickness of the glass via bar and wherein the glass via bar includes an integrated passive component, wherein the integrated passive component is disposed on one or more surfaces of the glass via bar or is embedded within the glass via bar.

2. The package-on-package of claim 1 wherein the first die is selected from the group consisting of a logic die, a memory die, a microelectromechanical systems (MEMS) die, a radio frequency (RF) die, a power integrated circuit (IC) die, a sensor die, and an actuator die.

3. The package-on-package of claim 1 wherein the second die is selected from the group consisting of a logic die, a memory die, a microelectromechanical systems (MEMS) die, a radio frequency (RF) die, a power integrated circuit (IC) die, a sensor die, and an actuator die.

4. The package-on-package of claim 1, wherein the first die and the second die are different types of dies.

5. The package-on-package of claim 4, wherein the first die is a logic die and the second die is a memory die.

6. The package-on-package of claim 5, wherein the memory die is attached to a substrate by flip-chip attachment.

7. The package-on-package of claim 5, wherein the memory die is a through silicon via (TSV) memory die.

8. The package-on-package of claim 1, further comprising a third package vertically integrated with the bottom package and the second package such that the second package is disposed between the bottom package and the third package.

9. The package-on-package of claim 1, wherein the integrated passive component is one of a resistor, an inductor, and a capacitor, or a combination thereof.

10. The package-on-package of claim 1, wherein the first die includes a processor and the integrated passive component is electrically connected to the processor.

11. The package-on-package of claim 1, wherein the integrated passive component is electrically connected to a via extending through the glass via bar.

12. The package-on-package of claim 1, further comprising an electronic device printed circuit board (PCB) attached to and in electrical communication with the bottom package.

13. The package-on-package of claim 1, wherein the bottom package further includes a mold embedding the first die and the glass via bar.

14. The package-on-package of claim 1, wherein the glass via bar is one of a borosilicate glass bar, a soda lime glass bar, a quartz bar, a Pyrex bar, or a photo-patternable glass bar.

15. The package-on-package of claim 1, wherein an electrical connection between the integrated passive component and a via of the glass via bar is provided by electrical routing on a surface of the glass via bar.

16. The package-on-package of claim 1, wherein the glass via bar has a thickness of between about 300 microns and 700 microns.

17. The package-on-package of claim 1, wherein a lateral dimension of the glass via bar is between about 1 and 15 mm.

18. The package-on-package of claim 1, wherein the integrated passive component is formed from one or more patterned layers on the one or more surfaces of the glass via bar.

19. The package-on-package of claim 1, wherein the first die and the glass via bar are attached and electrically coupled to the package substrate via a redistribution layer.

20. A package comprising:
a package substrate;
a die; and
a glass bar including one or more through-glass vias configured to electrically couple to the die, wherein the glass bar includes an amorphous silicate glass sidewall surface that extends through a thickness of the glass bar and wherein the glass bar includes an integrated passive component, wherein the integrated passive component is disposed on one or more surfaces of the glass bar or is embedded within the glass bar, wherein the die and the glass bar are attached to the same side of the package substrate, wherein the die is oriented laterally to the glass bar on the package substrate, and wherein the die and the through-glass vias of the glass bar are each electrically coupled to the package substrate by distinct electrical connections.

21. The package of claim 20, further comprising a mold embedding the glass bar and the die, the mold disposed on and attached to the package substrate.

22. The package of claim 21, wherein the one or more through-glass vias provide a conductive pathway extending through the entire thickness of the mold.

23. The package of claim 21, further comprising inter-level interconnects disposed on the package substrate opposite the mold.

24. The package of claim 20, wherein the die is a logic die.

25. The package of claim 24, wherein the integrated passive component is an integrated capacitor.

26. A system comprising the package of claim 20, the system further comprising:
a display;
a processor that is configured to communicate with the display, the processor being configured to process image data; and
a memory device that is configured to communicate with the processor.

27. The system of claim 26, further comprising:
a driver circuit configured to send at least one signal to the display; and
a controller configured to send at least a portion of the image data to the driver circuit,
wherein one or more of the processor, memory device, driver circuit, and controller include components in electrical connection with a through-glass via of the glass bar.

28. The system of claim 26, further comprising:
an image source module configured to send the image data to the processor,
wherein the image source module includes at least one of a receiver, transceiver, and transmitter and wherein one or more of the processor, memory device, receiver, transceiver, and transmitter include components in electrical connection with a through-glass via of the glass bar.

29. The system of claim 26, further comprising:
an input device configured to receive input data and to communicate the input data to the processor.

30. The package of claim 20, wherein the glass bar is one of a borosilicate glass bar, a soda lime glass bar, a quartz bar, a Pyrex bar, or a photo-patternable glass bar.

31. The package of claim 20, wherein the glass bar has a thickness of between about 300 microns and 700 microns.

32. The package of claim 20, wherein the integrated passive component is formed from one or more patterned layers on the one or more surfaces of the glass bar.

33. The package of claim 20, wherein the first die and the glass bar are attached and electrically coupled to the package substrate via a redistribution layer.

34. A package comprising:
a package substrate;
a die; and
a glass bar including one or more through-glass vias configured to electrically couple to the die, wherein the glass bar includes an amorphous silicate glass sidewall surface that extends through a thickness of the glass bar and wherein the glass bar includes an integrated passive component, wherein the integrated passive component is disposed on one or more surfaces of the glass bar or is embedded within the glass bar, further comprising a mold embedding the glass bar and the die, the mold disposed on and attached to the package substrate wherein the one or more through-glass vias provide a conductive pathway extending through the entire thickness of the mold.

* * * * *